(12) United States Patent
Etemadi (10) Patent No.: US 9,014,306 B2
(45) Date of Patent: Apr. 21, 2015

(54) IQ GAIN IMBALANCE CORRECTION FOR RECEIVERS EMPLOYING SIGMA-DELTA ANALOG TO DIGITAL CONVERSION

(75) Inventor: Farzad Etemadi, Laguna Niguel, CA (US)

(73) Assignee: Broadcom Corporation, Irvine, CA (US)

( * ) Notice: Subject to any disclaimer, the term of this patent is extended or adjusted under 35 U.S.C. 154(b) by 695 days.

(21) Appl. No.: 13/087,057

(22) Filed: Apr. 14, 2011

(65) Prior Publication Data

US 2012/0263262 A1    Oct. 18, 2012

(51) Int. Cl.
*H03D 3/22* (2006.01)
*H04L 27/38* (2006.01)

(52) U.S. Cl.
CPC .................. *H04L 27/3863* (2013.01)

(58) Field of Classification Search
USPC .................. 375/331, 324, 346, 332
See application file for complete search history.

(56) References Cited

U.S. PATENT DOCUMENTS 5,764,523 A * 6/1998 Yoshinaga et al. .............. 702/61
2006/0019624 A1* 1/2006 Suominen .................. 455/200.1

* cited by examiner

*Primary Examiner* — Kabir A Timory
(74) *Attorney, Agent, or Firm* — Sterne, Kessler, Goldstein & Fox P.L.L.C.

(57) ABSTRACT

Embodiments of an apparatus for improving a gain imbalance between an in-phase and quadrature component recovered by a receiver are provided. The apparatus includes a first transition counter configured to count a number of bit transitions in a first sequence of one-bit values provided by a first sigma-delta modulator based on the in-phase component, and a second transition counter configured to count a number of bit transitions in a second sequence of one-bit values provided by a second sigma-delta modulator based on the quadrature component. The apparatus further includes a gain monitor configured to: (1) determine a first and second power level, proportional to a power of the in-phase and quadrature components respectively, using the number of bit transitions in the first and second sequences, and (2) adjust a gain of one of the in-phase and quadrature components based on a ratio between the first and second power levels.

20 Claims, 8 Drawing Sheets

IQ GAIN IMBALANCE CORRECTION FOR RECEIVERS EMPLOYING SIGMA-DELTA ANALOG TO DIGITAL CONVERSION

FIELD OF THE INVENTION

This application relates generally to receivers and more particularly to in-phase/quadrature-phase receivers that employ sigma-delta analog-to-digital conversion.

BACKGROUND

A generalized in-phase/quadrature-phase receiver uses two mixers to demodulate a composite signal with magnitude and phase information into an in-phase component and a quadrature component. A first mixer receives the composite signal and an in-phase local oscillator signal and mixes these two signals together to produce a first down-converted signal. A second mixer receives the composite signal and a quadrature-phase local oscillator signal and mixes these two signals together to produce a second down-converted signal. The first down-converted signal is processed by a first low-pass filter to remove unwanted high-frequency portions, leaving the desired in-phase component, and the second down-converted signal is processed by a second low-pass filter to remove unwanted high-frequency portions, leaving the desired quadrature component.

Under ideal conditions, the first mixer and the first low pass filter supply an equal amount of gain to the in-phase component, as the second mixer and second low pass filter supply to the quadrature component. In actual practice, however, factors such as manufacturing process non-idealities, temperature, and supply voltage can cause a gain imbalance between these two branches (i.e., between the first mixer and the first low pass filter, which comprise a first branch, and the second mixer and the second low pass filter, which comprise a second branch).

A gain imbalance between the two branches can be reduced by comparing the average power of the in-phase component produced by the first branch and the average power of the quadrature phase component produced by the second branch and then using this information to adjust the gain of one or both branches. However, conventional approaches used to determine the average power of the in-phase component and the quadrature component typically require a relatively large amount of processing power, which can be costly in terms of the amount of hardware needed. This is especially true in in-phase/quadrature-phase receivers that use sigma-delta analog-to-digital conversion.

Therefore, what is needed is an apparatus for determining the average power of the in-phase component and quadrature component that is less costly in terms of hardware as compared to the conventional approaches.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will be described with reference to the accompanying drawings. The drawing in which an element first appears is typically indicated by the leftmost digit(s) in the corresponding reference number.

DETAILED DESCRIPTION

In the following description, numerous specific details are set forth in order to provide a thorough understanding of the invention. However, it will be apparent to those skilled in the art that the invention, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the invention.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

1. Exemplary Operating Environment

Figure 1:
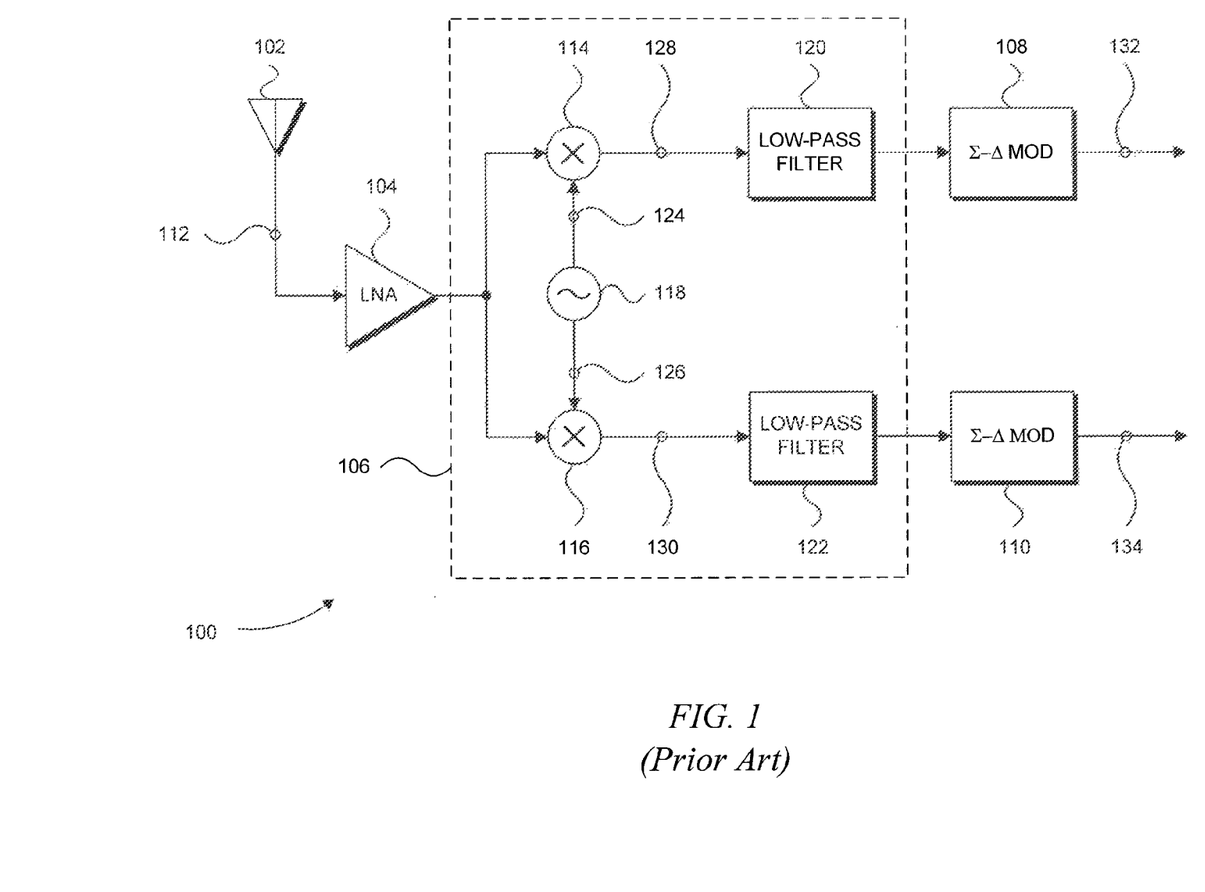
FIG. 1 illustrates a conventional wireless receiver front-end in which embodiments of the present invention can operate.

FIG. 1 illustrates a conventional wireless receiver front-end 100 in which embodiments of the present invention can operate. The conventional wireless receiver front-end 100 includes an antenna 102, a low-noise amplifier (LNA) 104, an in-phase/quadrature-phase demodulator 106, and a pair of sigma-delta modulators 108 and 110, which can be used in conjunction with a low pass filter and decimator (not shown) to perform analog-to-digital conversion.

In operation, conventional wireless receiver front-end 100 is configured to receive a composite signal with magnitude and phase information and demodulate the composite signal into an in-phase component and a quadrature component. More specifically, in operation, antenna 102 first receives a composite signal 112 with magnitude and phase information and provides the composite signal 112 to LNA 104, which then amplifies the composite signal 112 and provides the amplified composite signal to in-phase/quadrature-phase demodulator 106.

In-phase/quadrature-phase demodulator 106 includes a pair of mixers 114 and 116, a local oscillator (LO) generator 118, and a pair of low-pass filters 120 and 122. Mixer 114 receives the amplified composite signal 112 from LNA 104 and mixes the amplified composite signal 112 with an in-phase LO signal 124 provided by LO generator 118. The mixed signal is provided as a first down-converted signal 128 at the output of mixer 114.

Mixer 116 of in-phase/quadrature-phase demodulator 106 further receives the amplified composite signal 112 from LNA 104 and mixes the amplified composite signal 112 with a quadrature-phase LO signal 126 provided by LO generator 118. Quadrature-phase LO signal 126 ideally is 90 degrees out of phase with in-phase LO signal 124. The mixed signal is provided as a second down-converted signal 130 at the output of mixer 116.

After being provided by mixers 114 and 116, the two down-converted signals 128 and 130 are respectively filtered by low-pass filters 120 and 122 to remove unwanted high-frequency portions and, thereafter, are digitized (at least in part) by sigma-delta modulators 108 and 110. At the output of sigma-delta modulator 108, a digital in-phase component signal 132 is provided, and at the output of sigma-delta modulator 110, a digital quadrature component signal 134 is provided. The implementation, theory, and operation of Sigma-delta modulators are well known in the arts and sigma-delta modulators 108 and 110 can include any reasonable sigma-delta modulator implementation, including first order and higher order implementations.

Together, corresponding samples of the two digital signals 132 and 134 (after having been low-pass filtered and decimated) represent complex symbols: the real portion of each complex symbol corresponds to the in-phase component, and the imaginary portion of each complex symbol corresponds to the quadrature component. The stream of complex symbols provided by the two digital signals 132 and 134 can subsequently be de-mapped by a de-mapper (not shown) into a bit stream of data. The de-mapper can operate in accordance with any one of a plurality of different modulation formats (e.g., QAM, QPSK, GMSK, etc.) and constellation sizes to de-map the complex symbols.

Successful and efficient recovery of the bit stream from the complex symbols is often dependent on the two branches of in-phase/quadrature-phase demodulator 106 supplying the same amount of gain to the in-phase and quadrature-phase components that each produces. Mixer 114 and low pass filter 120 comprise a first one of the two branches, and mixer 116 and low pass filter 122 comprise a second one of the two branches. In general, each element within in-phase/quadrature-phase demodulator 106, including LO generator 118, can contribute to the gain imbalance between the two branches.

Under ideal conditions, no gain imbalance exists between the two branches and the in-phase LO signal 124 and the quadrature-phase LO signal 126 can be represented mathematically as:

$$LO_I = \cos(2\pi f_{LO} t) \tag{1}$$

$$LO_Q = \sin(2\pi f_{LO} t) \tag{2}$$

where the sine wave of the in-phase LO signal 124 has a frequency of $f_{LO}$ and the cosine wave of the quadrature phase LO signal 126 has the same frequency $f_{LO}$.

Assuming, for illustration purposes, that the composite signal 112 received by antenna 102 can be mathematically represented as:

$$S_C = I(t) \cdot \cos(2\pi f_{LO} t) + Q(t) \cdot \sin(2\pi f_{LO} t) \tag{3}$$

where I(t) is the in-phase component signal and Q(t) is the quadrature phase component signal, the first down converted signal 128 provided by mixer 114 can be further mathematically represented as:

$$D_I = LO_I \cdot S_C \tag{4}$$

$$= \cos(2\pi f_{LO} t) \cdot [I(t) \cdot \cos(2\pi f_{LO} t) + Q(t) \cdot \sin(2\pi f_{LO} t)] \tag{5}$$

$$= 1/2 I(t) \cdot [1 + \cos(4\pi f_{LO} t)] + 1/2 Q(t) \cdot \sin(4\pi f_{LO} t) \tag{6}$$

and the second down converted signal 130 provided by mixer 116 can be mathematically represented as:

$$D_Q = LO_Q \cdot S_C \tag{7}$$

$$= \sin(2\pi f_{LO} t) \cdot [I(t) \cdot \cos(2\pi f_{LO} t) + Q(t) \cdot \sin(2\pi f_{LO} t)] \tag{8}$$

$$= 1/2 Q(t) \cdot [1 + \sin(4\pi f_{LO} t)] + 1/2 I(t) \cdot \cos(4\pi f_{LO} t) \tag{9}$$

Subsequent filtering performed by low pass filters 120 and 122 on the down converted signals 128 and 130, represented by equations 6 and 9 respectively, removes the high frequency terms (containing $4\pi f_{LO} t$) leaving only the in-phase component signal I(t) and the quadrature phase component signal Q(t), which are both divided by a factor of two and thus have received an identical gain.

Under non-ideal conditions, a gain imbalance exists between the two branches of in-phase/quadrature-phase demodulator 106. To illustrate and model the effect of gain imbalance, the in-phase LO signal 124 can be represented as including a gain imbalance term $\epsilon$ as follows:

$$\overline{LO_I} = (1+\epsilon)\cos(2\pi f_{LO} t) \tag{10}$$

As shown in equation 10, the in-phase LO signal 124 is modeled as including a gain imbalance term $\epsilon$ that represents a gain imbalance between the two branches of in-phase/quadrature-phase demodulator 106. Accordingly, the down converted signal 128 of mixer 114, under these non-ideal conditions, is mathematically represented as:

$$\overline{D_I} = \overline{LO_I} \cdot S_C \tag{11}$$

$$= (1+\epsilon) \cdot \cos(2\pi f_{LO} t) \cdot [I(t) \cdot \cos(2\pi f_{LO} t) + Q(t) \cdot \sin(2\pi f_{LO} t)] \tag{12}$$

$$= 1 + \epsilon/2 I(t) \cdot [1 + \cos(4\pi f_{LO} t)] + 1/2 Q(t) \cdot \sin(4\pi f_{LO} t) \tag{13}$$

Subsequent filtering performed by low pass filter 120 on the down converted signal 128, represented by equation 13, removes the high frequency terms (containing $4\pi f_{LO} t$) leaving only the in-phase component signal I(t), which is now multiplied by a factor of $(1+\epsilon)/2$. Thus, the in-phase component and the quadrature component no longer receive identical gains as a result of the gain imbalance between the two branches of in-phase/quadrature-phase demodulator 106.

It should be noted that conventional wireless receiver front-end 100 represents only one exemplary environment in which embodiments of the present invention can operate. For example, embodiments of the present invention can further operate within wired receivers and receivers employing heterodyne, as opposed to homodyne, architectures. In general, and as will be explained further below, features of the present invention can be implemented within any reasonable complex receiver that implements sigma-delta modulators.

Figure 2:
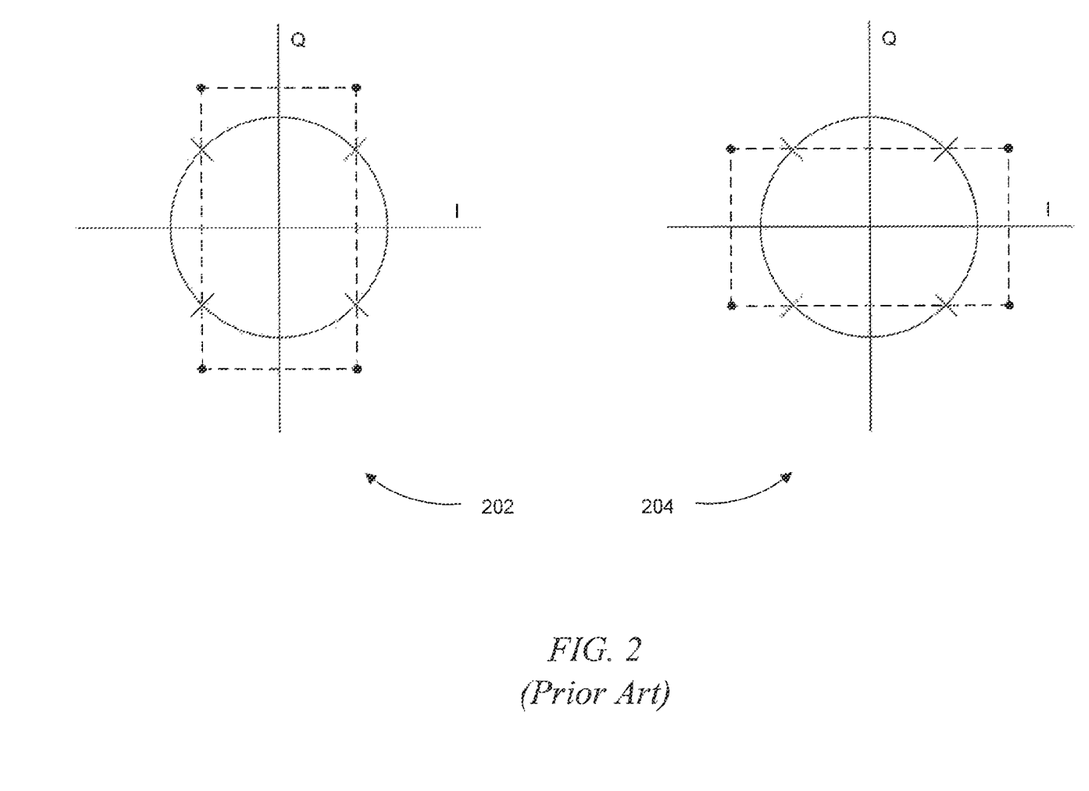
FIG. 2 illustrates a gain imbalance between an in-phase component and a quadrature component produced by a receiver.

Turning now to FIG. 2, an illustration of how a gain imbalance between the two branches of conventional wireless receiver front-end 100 results in a difference in scaling between the recovered in-phase component signal and quadrature phase component signal, which were respectively recovered by the two branches, is provided. In particular, FIG. 2 illustrates two plots 202 and 204 that each include a circle with four ticks marks; the tick marks indicate the ideal, recovered magnitudes for samples of the in-phase component signal and quadrature phase component signal recovered by wireless receiver front-end 100 (under the assumption that the two component signals were transmitted and received by wireless receiver front-end 100 with equal magnitudes).

Plot 202 illustrates the effect when the quadrature component signal receives a larger gain relative to the in-phase quadrature component signal. The position of each dark dot in plot 202 represents the recovered magnitudes for each component. Plot 204 illustrates the effect when the in-phase component signal receives a larger gain relative to the quadrature component signal. Again, the position of each dark dot in plot 204 represents the recovered magnitude for each component.

2. Conventional Approach to Gain Imbalance Correction

Figure 3:
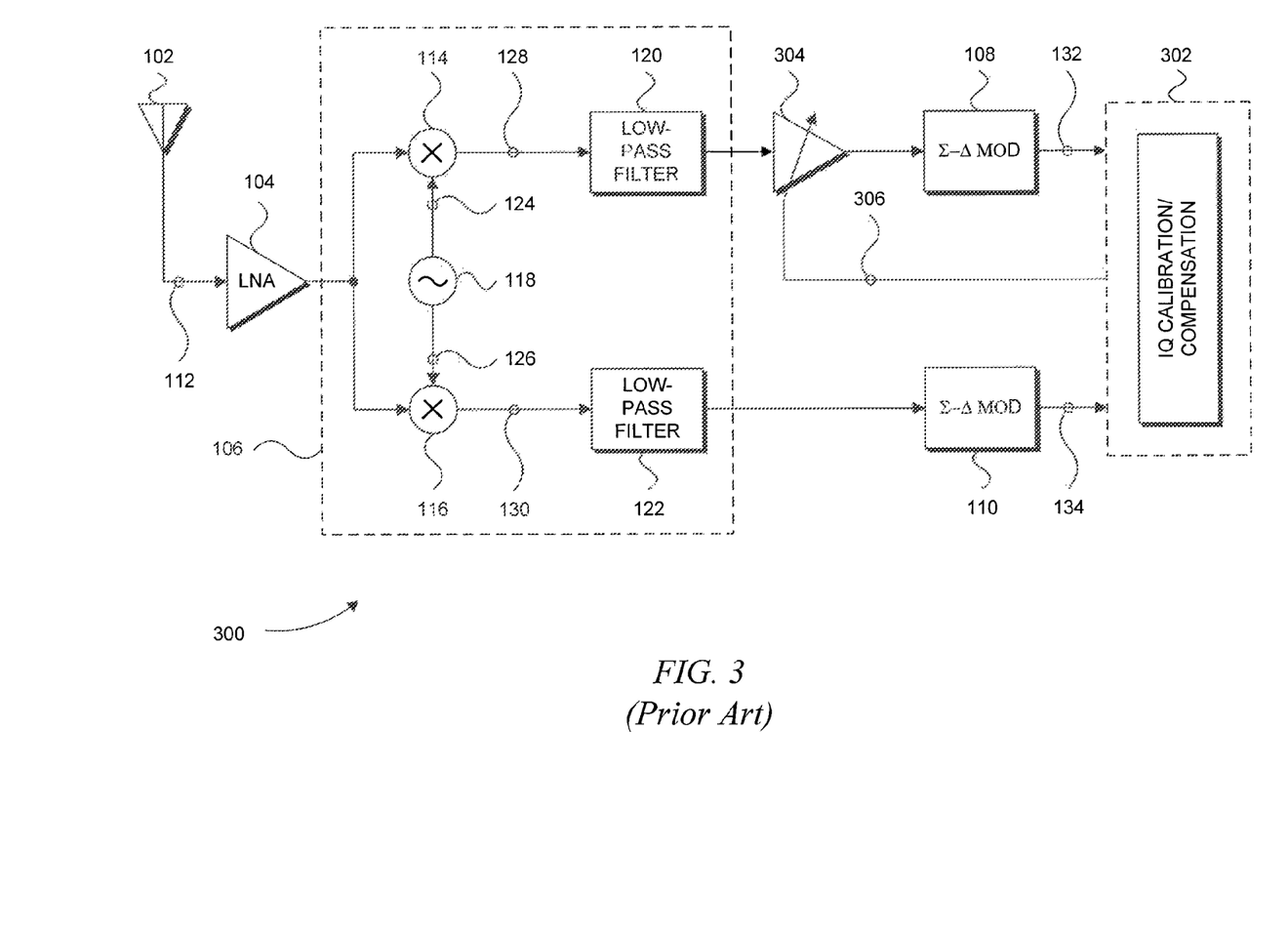
FIG. 3 illustrates a conventional wireless receiver front-end using a conventional gain imbalance correction technique.

FIG. 3 illustrates a conventional wireless receiver front-end 300 using a conventional gain imbalance correction technique. In particular, conventional wireless receiver front-end 300 includes a substantially similar structure as wireless receiver front-end 100 illustrated in FIG. 1 with the exception of the following additional elements to correct for gain imbalance between the two branches of in-phase/quadrature-phase demodulator 106: a digital signal processor (DSP) 302 and a variable gain amplifier (VGA) 304, which is positioned between low-pass filter 120 and sigma-delta modulator 108.

Sigma-delta modulators, such as sigma-delta modulators 108 and 110, are typically used in conjunction with a low pass filter and a decimator to fully perform analog-to-digital conversion. In general, a sigma-delta modulator samples an input analog signal at rate much higher than the Nyquist rate (i.e., at a rate much higher than twice the bandwidth of the analog input signal). The sigma-delta modulator then converts the sampled analog signal values into a sequence of one-bit values at its output that are either a logical one or a logical zero; in crude terms, as the analog input signal increases, the number of logical ones in the serial bit-stream increases at the output of the sigma-delta modulator, and as the analog input signal decreases the number of logical zeros in the serial bit-stream decreases. Low pass filtering and decimation can be performed on the serial bit stream output by the sigma-delta modulator to produce the final digital representation of the analog input signal received by the sigma-delta modulator.

The input power of an analog signal received and processed by a sigma-delta modulator, such as sigma-delta modulators 108 and 110, cannot be directly measured by the sequence of one-bit values it produces. Rather, and as is conventionally performed, when an average power estimate is desired of the analog input signal, the sequence of one-bit values produced by a sigma-delta modulator is low-pass filtered, decimated, and then squared to determine average power. Such processing, however, can be costly in terms of hardware.

In conventional wireless receiver front-end 300, the conventional gain imbalance correction technique it employs performs these three processing techniques with DSP 302 on in-phase component signal 132, produced by sigma-delta modulator 108, and quadrature component signal 134, produced by sigma-delta modulator 110, to determine the average power of these signals. DSP 132 then compares the power of these two signals to correct for any gain imbalance between the two branches of in-phase/quadrature phase demodulator 106. More specifically, DSP 132 compares the power of these two signals to correct for any gain imbalance between the branch comprising mixer 114 and low pass-filter 120, and the branch comprising mixer 116 and low-pass filter 122, by adjusting a gain of variable gain amplifier 304 to compensate for any gain imbalance.

Embodiments of the present invention provide an apparatus for determining the average input power of an analog signal received and processed by a sigma-delta modulator, such as sigma-delta modulators 108 and 110, without the need to perform the complex operations of low-pass filtering, decimation, and squaring using DSP 302. Eliminating these complex operations can significantly reduce hardware requirements.

3. Improved Approach to Gain Imbalance Correction

Figure 4:
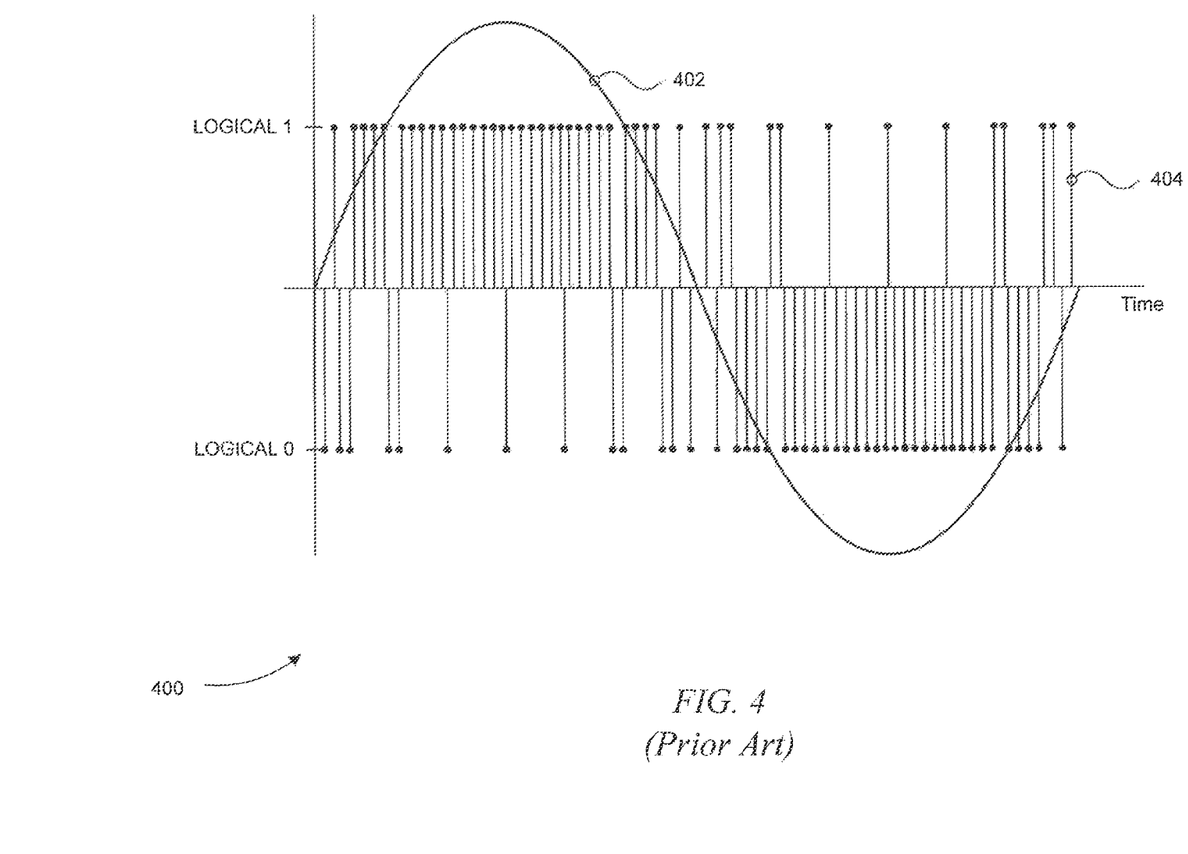
FIG. 4 illustrates an exemplary output signal produced by a sigma-delta analog-to-digital converter for a single tone input signal.

FIG. 4 illustrates an exemplary input/output plot 400 of a sigma-delta modulator, such as sigma-delta modulators 108 and 110 illustrated in FIG. 1 and FIG. 3. More specifically, input/output plot 400 illustrates a sine wave analog input signal 402 that is received and processed by a sigma-delta modulator, and a one-bit digital sequence 404 that represents the discrete time output signal of the sigma-delta modulator. The one-bit digital sequence 404 is produced by an exemplary sigma-delta modulator based on the sine wave analog input signal 402.

As can be seen from input/output plot 400, there are more logical one values in the one-bit digital sequence 404 when the magnitude of the sine wave analog input signal 402 has a large, positive value. Conversely, there are more logical zero values in the one-bit digital sequence 404 when the magnitude of the sine wave analog input signal 402 has a large, negative value. When the magnitude of the sine wave analog input signal 402 is at or around zero, there are nearly an equal number of logical one and logical zero values in the one-bit digital sequence 404. Digital low-pass filtering of the one-bit digital sequence 404 produced by the sigma-delta modulator can be performed to obtain the sine wave analog input signal 402 in a digital format.

A further important characteristic of the output produced by a sigma-delta modulator in response to an input signal can be further seen by input/output plot 400. In particular, when the magnitude of the analog input signal 402 has a large, positive value, there are fewer transitions in the one-bit digital sequence 404, compared to when the magnitude of the analog input signal 402 is small, because there are more logical one values in the one-bit digital sequence 404 during this time. In other words, the one-bit digital sequence 404 transitions less often from a logical one value to a logical zero value (or vice versa) when the magnitude of the analog input signal 402 has a large, positive value, compared to when the magnitude of the analog input signal 402 is small.

Similarly, when the magnitude of the analog input signal 402 has a large, negative value, there are fewer transitions in the one-bit digital sequence 404, compared to when the magnitude of the analog input signal 402 is small, because there are more logical zero values in the one-bit digital sequence 404 during this time. In other words, the one-bit digital sequence 404 transitions less often from a logical one value to a logical zero value (or vice versa) when the magnitude of the analog input signal 402 has a large, negative value, compared to when the magnitude of the analog input signal 402 is small.

In general, there are more transitions in the one-bit digital sequence 404, from a logical one value to a logical zero value (or vice versa) when the magnitude of the analog input signal 402 is smaller in value and there are less transitions in the one-bit digital sequence 404, from a logical one value to a logical zero (or vice versa) when the magnitude of the analog input signal 402 is large in value. The most transitions in the one-bit digital sequence 404 illustrated in FIG. 4 generally occurs when the sine wave analog input signal 402 has a magnitude value at or around zero.

Figure 5:
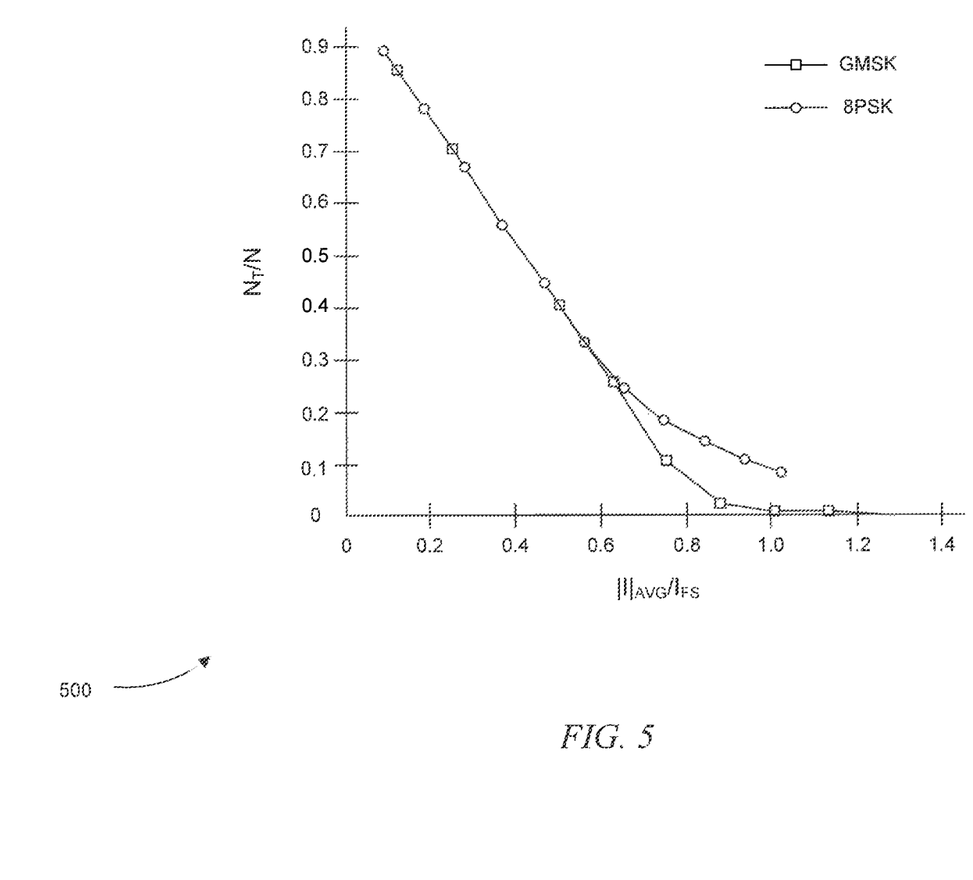
FIG. 5 illustrates an inverse relationship between the number of bit transitions in an output sequence, produced by a sigma-delta analog-to-digital converter based on an input signal, and the average absolute value of the input signal, according to embodiments of the present invention.

FIG. 5 illustrates this inverse relationship 500 between the number of transitions ($N_T$) in the output sequence of an exemplary sigma-delta modulator, normalized by the total number of values in the output sequence N, versus the average absolute value of the input signal ($|I|_{AVG}$) from which the output sequence was produced, normalized by the full scale input ($I_{FS}$) of the sigma-delta modulator, according to embodiments of the present invention.

From FIG. 5, the inverse and monotonic relationship is readily seen between the number of transitions ($N_T$), in the output sequence of an exemplary sigma-delta modulator, and the average absolute value of the input signal ($|I|_{AVG}$). In general, the relationship is linear and independent of the modulation of the input signal to the sigma-delta modulator. FIG. 5 specifically illustrates the inverse relationship between the number of transitions ($N_T$) in the output sequence of an exemplary sigma-delta modulator and the average absolute value of the input signal ($|I|_{AVG}$) for two different input signals: one modulated in accordance with GMSK and the other in accordance with 8PSK. This inverse and monotonic relationship can be obtained experimentally for any reasonable sigma-delta modulator, as would be appreciated by one of ordinary skill in the art based on the teachings herein.

Using the information plotted in FIG. 5, a mathematical relationship between the number of transitions ($N_T$) in the output sequence of an exemplary sigma-delta modulator, normalized by the total number of values in the output sequence N, and the expected average absolute value of the input signal ($|I|_{AVG}$), normalized by the full scale input ($I_{FS}$) of the sigma-delta modulator, can be expressed as:

$$\frac{N_T}{N} = a \cdot E\left[\frac{|x|}{I_{FS}}\right] + b \quad (14)$$

Solving for $E[|x|/I_{FS}]$, equation (14) can be rewritten as follows:

$$E\left[\frac{|x|}{I_{FS}}\right] = \frac{\left(\frac{N_T}{N} - b\right)}{a} \quad (15)$$

In equations (14) and (15) above, E[ ] is the expectation operator, $E[|x|/I_{FS}]$ is the expected average absolute value of the input signal ($|I|_{AVG}$) normalized by the full scale input ($I_{FS}$) for a given number of transitions ($N_T$) in the output sequence normalized by the total number of values in the output sequence N, 'a' is an approximate slope of the line illustrated in FIG. 5, and 'b' is an approximate y intercept of the line illustrated in FIG. 5.

The value of $E[|x|/I_{FS}]$ provides a good estimate of the average input power of the sigma-delta modulator. Thus, by experimentally obtaining the values of 'a' and 'b' in equation (15) for a give sigma-delta modulator, such as those shown in FIGS. 1 and 3, the average power of the input signal processed by the sigma-delta modulator can be estimated by simply counting the total number of values in the sequence of one-bit values it produces and the number of transitions in that sequence. This low complexity operation requires no low-pass filtering, decimation, or squaring.

Figure 6:
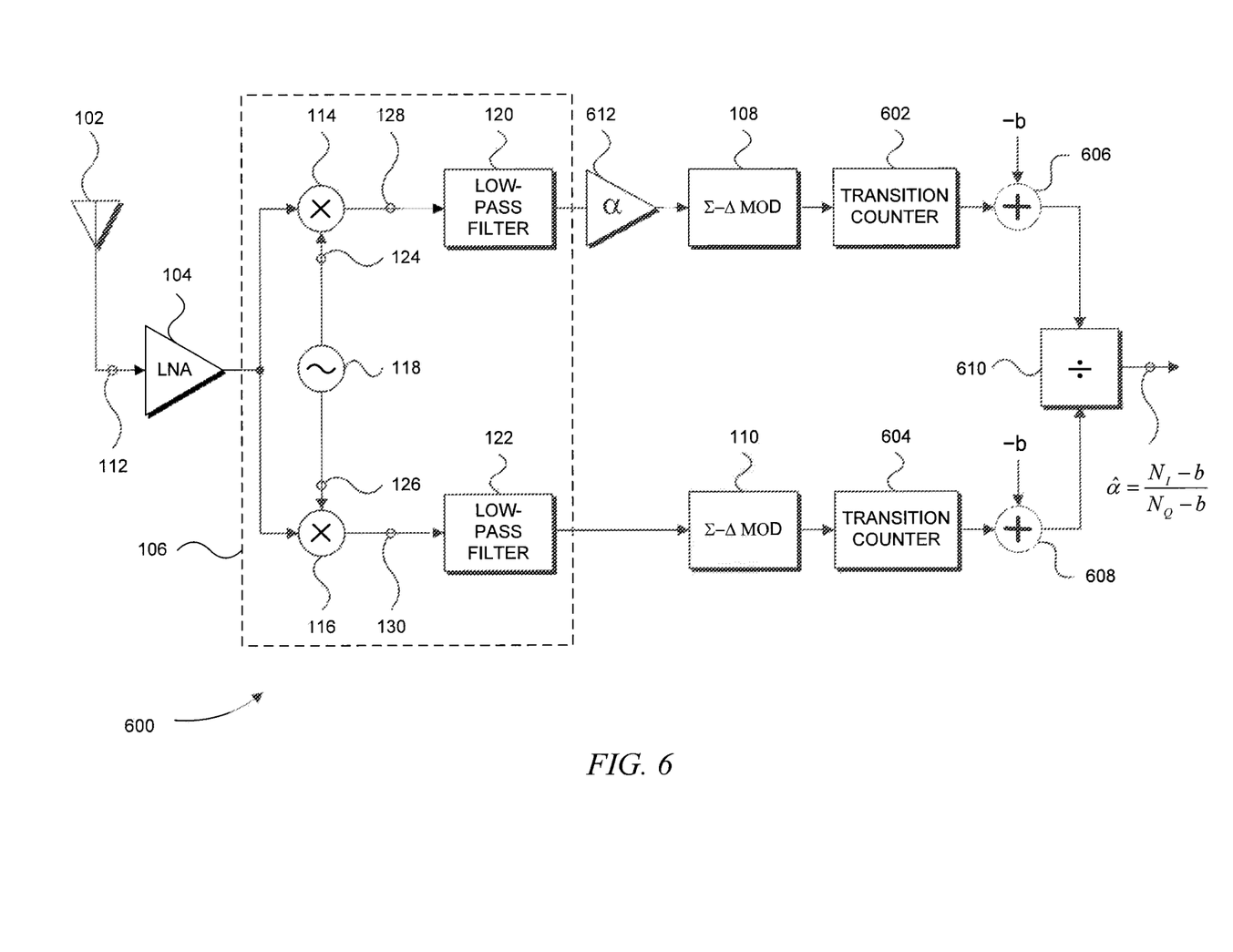
FIG. 6 illustrates a wireless receiver front-end utilizing the inverse relationship illustrated in FIG. 5 to improve IQ gain imbalance in the wireless receiver front-end, according to embodiments of the present invention.

FIG. 6 illustrates a wireless receiver front-end 600 using a gain imbalance correction technique based on the relationship expressed in equation (15) above, according to embodiments of the present invention. In particular, wireless receiver front-end 600 includes a substantially similar structure as wireless receiver front-end 100 illustrated in FIG. 1 with the exception of the following additional elements to correct for gain imbalance between the two branches of in-phase/quadrature-phase demodulator 106: a pair of transition counters 602 and 604, a pair of adders 606 and 608, a divider 610, and a variable gain amplifier (VGA) 612. The additional pair of adders 606 and 608 and the divider 610 can be collectively referred to as a gain monitor.

Transition counter 602 is configured to count the number of bit transitions in the sequence of one-bit values produced by sigma-delta modulator 108. Similarly, transition counter 604 is configured to count the number of bit transitions in the sequence of one-bit values produced by sigma-delta modulator 110.

Adders 606 and 608 are then configured to add the experimentally obtained value of '−b' (for sigma-delta modulators 108 and 110) to the number of bit transitions counted by transition counters 602 and 604, respectively. The method of obtaining the value of 'b' (and thereby '−b') was described above in regard to FIG. 5. In general, for similarly implemented sigma-delta modulators the same value 'b' and 'a' can be attributed to both sigma-delta modulators, as has been done in FIG. 6. However, it should be noted that where, for example, the difference between the sigma-delta modulators is non-negligible or is not desired to be ignored, experimentally obtained values for 'b' and 'a' can be obtained for each sigma-delta modulator and used in obtaining the ultimate value $\hat{\alpha}$ at the output of divider 610, as would be appreciated by one of ordinary skill in the art. Where different values of 'a' are attributed to the two sigma-delta modulators, two additional dividers may be required.

Finally, divider 610 is configured to divide the output sum produced by adder 606 by the output sum produced by adder 608 to obtain a (estimated) measure of gain imbalance between the two branches of in-phase/quadrature-phase demodulator 106. This value can then be used to update the gain of VGA 612 to compensate for the measured gain imbalance. More specifically, the gain of VGA 612 can be set equal to the reciprocal of this value (i.e., α can be set equal to 1/$\hat{\alpha}$). Alternatively, the output sum produced by adder 608 can be divided by the output sum produced by adder 606 and the gain of VGA 612 can be set equal to the resulting value of the division (i.e., α can be set equal to $\hat{\alpha}$).

It should be noted that wireless receiver front-end 600 represents only one exemplary environment in which embodiments of the present invention can operate. For example, embodiments of the present invention can further operate within wired receivers and receivers employing heterodyne, as opposed to homodyne, architectures. In general, features of the present invention can be implemented within any reasonable complex receiver that implements sigma-delta modulators.

It should be further noted that divider 610 can alternatively be configured to divide the output sum produced by adder 608 by the output sum produced by adder 606 to obtain a measure of gain imbalance between the two branches of in-phase/quadrature-phase demodulator 106. This value can then be used to update the gain of a VGA (not shown) sitting between low-pass filter 122 and sigma-delta modulator 110 to compensate for the measured gain imbalance, as opposed updating the gain of VGA 612 illustrated in FIG. 6. In this instance, VGA 612 can be removed. It should be further noted that the measured gain imbalance produced by divider 610 can be used to adjust two VGAs, such as VGA 612 and an additional VGA (not shown) sitting between low-pass filter 122 and sigma-delta modulator 110 to compensate for the measured gain imbalance.

Figure 7:
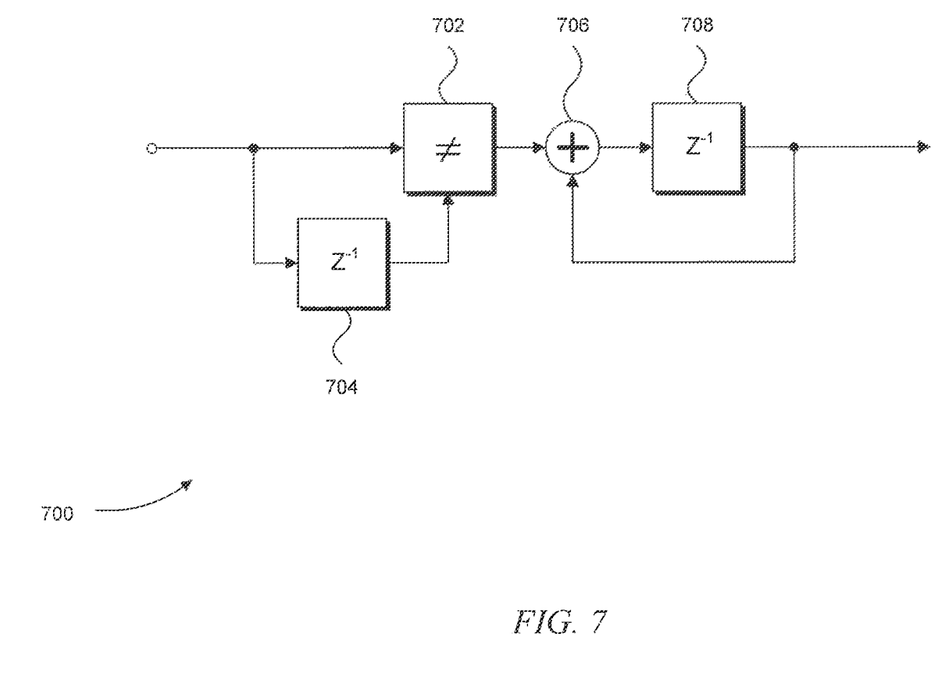
FIG. 7 illustrates a block diagram of an exemplary transition counter, according to embodiments of the present invention.

Referring now to FIG. 7, a block diagram of an exemplary transition counter 700, according to embodiments of the present invention is illustrated. In one embodiment, at least one of transition counter 602 and 604, illustrated in FIG. 6, is implemented in the same or similar manner as exemplary transition counter 700.

As shown in FIG. 7, transition counter 700 includes a one-bit comparator 702, a memory element 704, and an accumulator comprising an adder 706 and a memory element 708. In operation, comparator 702 compares a just received one-bit value to a previous one-bit value received and stored by memory element 704. If the just received one-bit value is not equal to the previous one-bit value received and stored by memory element 704, a transition within the bit sequence is indicated, and comparator 702 outputs a logical one value. If, however, the just received one-bit value is equal to the previous one-bit value received, no transition has occurred, and comparator 702 outputs a logical zero value. The one-bit value stored in memory element 704 is subsequently updated after the comparison operation with the just received one-bit value.

The output of comparator 702 is added by adder 706 to the previous accumulation total, or count total, of the number of transitions detected. This total count value is stored in memory element 708 and is feedback to adder 706. The total count value is then updated with the summation result produced by adder 706. The total count value is provided as the output of transition counter 700.

4. Improved Approach to Sigma-Delta Modulator Clip Detection

Figure 8:
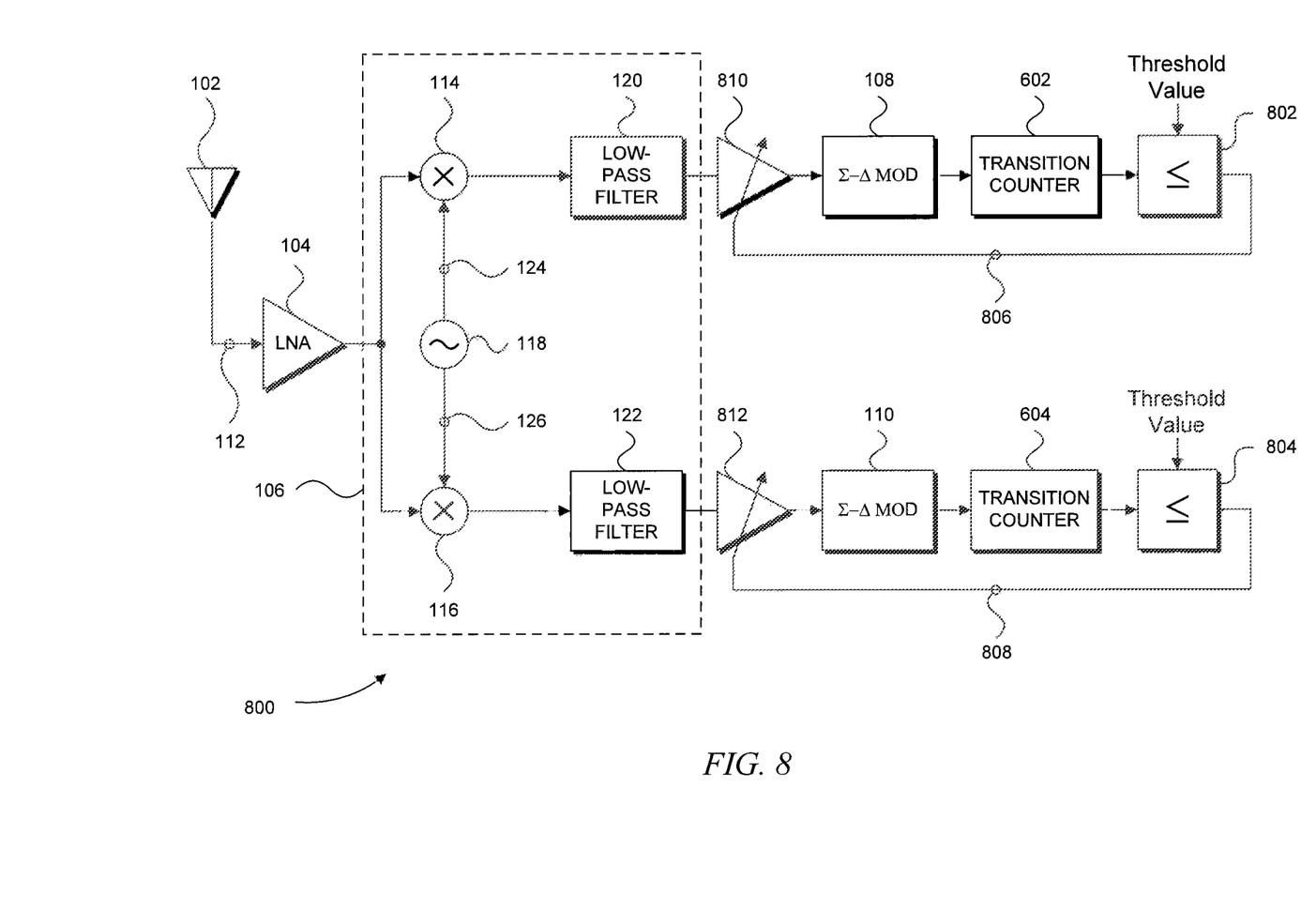
FIG. 8 illustrates a wireless receiver front-end utilizing the inverse relationship illustrated in FIG. 5 to detect and reduce saturation of an analog-to-digital converter used within the wireless receiver front-end, according to embodiments of the present invention.

FIG. 8 illustrates a wireless receiver front-end 800 that includes logic to perform clip detection and correction, according to embodiments of the present invention. In particular, wireless receiver front-end 800 includes a substantially similar structure as wireless receiver front-end 100 illustrated in FIG. 1 with the exception of the following additional elements to perform clip detection and correction: a pair of transition counters 602 and 604, a pair of comparators 802 and 804, and a pair of variable gain amplifiers (VGAs) 810 and 812.

As discussed above, transition counter 602 is configured to count the number of bit tansitions in the sequence of one-bit values produced by sigma-delta modulator 108. Similarly, transition counter 604 is configured to count the number of bit transitions in the sequence of one-bit values produced by sigma-delta modulator 110.

As further discussed above, the total number of bit transitions in the sequence of one-bit values produced by sigma-delta modulator 108, normalized by the total number of bits in the sequence, is indicative of the average power of the analog input signal received and processed by sigma-delta modulator 108. Similarly, the total number of bit transitions in the sequence of one-bit values produced by sigma-delta modulator 110, normalized by the total number of bits in the sequence, is indicative of the average power of the analog input signal received and processed by sigma-delta modulator 110.

Thus, by comparing the total count values produced by transition counters 602 and 604, normalized by the total number of bits in their respective sequences, to a threshold value that represents the point where sigma-delta modulators 108 and 110 become saturated, clipping can be detected and avoided. More specifically, comparators 802 and 804 can perform these comparisons operations using two, respective threshold values and then use the results of these comparison operations to adjust VGAs 810 and 812, respectively. For example, if the output of comparator 802 indicates that the total number of bit transitions in the sequence of one-bit values produced by sigma-delta modulator 108, normalized by the total number of bits in the sequence is smaller than the threshold value, the comparator can reduce the gain of VGA 810 to avoid clipping.

5. Conclusion

It is to be appreciated that the Detailed Description section, and not the Abstract section, is intended to be used to interpret the claims. The Abstract section may set forth one or more but not all exemplary embodiments of the present invention as contemplated by the inventor(s), and thus, is not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A receiver comprising:
    a demodulator configured to demodulate a composite signal with magnitude and phase information into an in-phase component and a quadrature component;
    a first sigma-delta modulator configured to convert the in-phase component into a first discrete time signal comprising a first sequence of one-bit values;
    a second sigma-delta modulator configured to convert the quadrature component into a second discrete time signal comprising a second sequence of one-bit values;
    a first transition counter configured to count a number of bit transitions in the first sequence of one-bit values;
    a second transition counter configured to count a number of bit transitions in the second sequence of one-bit values; and
    a gain monitor configured to:
        determine a first power level using the number of bit transitions in the first sequence,
        determine a second power level using the number of bit transitions in the second sequence, and adjust a gain of at least one of the in-phase component and the quadrature component based on a ratio between the first power level and the second power level.

2. The receiver of claim 1, wherein the gain monitor comprises:
a first adder configured to add a first constant value to the number of bit transitions in the first sequence to determine the first power level; and
a second adder configured to add a second constant value to the number of bit transitions in the second sequence to determine the second power level.

3. The receiver of claim 2, wherein the gain monitor further comprises:
a divider configured to divide the first power level by the second power level to determine the ratio.

4. The receiver of claim 3, wherein the gain monitor adjusts the gain of the in-phase component based on the ratio.

5. The receiver of claim 2, wherein the gain monitor further comprises:
a divider configured to divide the second power level by the first power level to determine the ratio.

6. The receiver of claim 3, wherein the gain monitor adjusts the gain of the quadrature component based on the ratio.

7. The receiver of claim 1, wherein the first transition counter comprises:
a comparator configured to compare a first one-bit value of the first sequence to a second one-bit value of the first sequence to determine if the first one-bit value is equal to the second one-bit value, wherein the first one-bit value and the second one-bit value are immediately adjacent to each other in the first sequence; and
an accumulator configured to increment the number of bit transitions in the first sequence of one-bit values if the first one-bit value is not equal to the second one-bit value as determined by the comparator.

8. The receiver of claim 7, wherein the first transition counter further comprises:
a memory element configured to store the first one-bit value of the first sequence.

9. The receiver of claim 1, wherein the second transition counter comprises:
a comparator configured to compare a first one-bit value of the second sequence to a second one-bit value of the second sequence to determine if the first one-bit value is equal to the second one-bit value, wherein the first one-bit value and the second one-bit value are immediately adjacent to each other in the second sequence; and
an accumulator configured to increment the number of bit transitions in the second sequence of one-bit values if the first one-bit value is not equal to the second one-bit value as determined by the comparator.

10. The receiver of claim 9, wherein the second transition counter further comprises:
a memory element configured to store the first one-bit value of the second sequence.

11. A method for calibrating a gain of an in-phase component and a gain of a quadrature component in a receiver:
demodulating a composite signal with magnitude and phase information into the in-phase component and the quadrature component;
using a first sigma-delta modulator to convert the in-phase component into a first discrete time signal comprising a first sequence of one-bit values;
using a second sigma-delta modulator to convert the quadrature component into a second discrete time signal comprising a second sequence of one-bit values;
counting a number of bit transitions in the first sequence of one-bit values;
counting a number of bit transitions in the second sequence of one-bit values;
determining a first power level using the number of bit transitions in the first sequence;
determining a second power level using the number of bit transitions in the second sequence; and
adjusting a gain of at least one of the in-phase component and the quadrature component based on a ratio between the first power level and the second power level.

12. The method of claim 11, wherein:
the determining the first power level further comprises adding a first constant value to the number of bit transitions in the first sequence to determine the first power level, and
the determining the second power level further comprises adding a second constant value to the number of bit transitions in the second sequence to determine the second power level.

13. The method of claim 11, wherein the adjusting the gain of at least one of the in-phase component and the quadrature component further comprises:
dividing the first power level by the second power level to determine the ratio.

14. The method of claim 13, wherein the gain of the in-phase component is adjusted based on the ratio.

15. The method of claim 11, wherein the adjusting the gain of at least one of the in-phase component and the quadrature component further comprises:
dividing the second power level by the first power level to determine the ratio.

16. The method of claim 15, wherein the gain of the quadrature component is adjusted based on the ratio.

17. The method of claim 11, wherein the counting the number of bit transitions in the first sequence of one-bit values further comprises:
comparing a first one-bit value of the first sequence to a second one-bit value of the first sequence to determine if the first one-bit value is equal to the second one-bit value, wherein the first one-bit value and the second one-bit value are immediately adjacent to each other in the first sequence; and
incrementing the number of bit transitions in the first sequence of one-bit values if the first one-bit value is not equal to the second one-bit value.

18. The method of claim 11, wherein the counting the number of bit transitions in the second sequence of one-bit values further comprises:
comparing a first one-bit value of the second sequence to a second one-bit value of the second sequence to determine if the first one-bit value is equal to the second one-bit value, wherein the first one-bit value and the second one-bit value are immediately adjacent to each other in the second sequence; and
incrementing the number of bit transitions in the second sequence of one-bit values if the first one-bit value is not equal to the second one-bit value as determined by the comparator.

19. An apparatus for improving a gain imbalance between an in-phase component and a quadrature component, comprising:
a first transition counter configured to count a number of bit transitions in a first sequence of one-bit values provided by a first sigma-delta modulator based on the in-phase component;

a second transition counter configured to count a number of bit transitions in a second sequence of one-bit values provided by a second sigma-delta modulator based on the quadrature component; and a gain monitor configured to
- determine a first power level using the number of bit transitions in the first sequence,
- determine a second power level using the number of bit transitions in the second sequence, and
- adjust a gain of at least one of the in-phase component and the quadrature component based on a ratio between the first power level and the second power level.

20. The apparatus of claim 19, wherein the gain monitor comprises:

a first adder configured to add a first constant value to the number of bit transitions in the first sequence to determine the first power level; and a second adder configured to add a second constant value to the number of bit transitions in the second sequence to determine the second power level.

* * * * *